US012755704B2

United States Patent
(12) United States Patent
Park

(10) Patent No.: US 12,755,704 B2
(45) Date of Patent: Oct. 6, 2026

(54) DISPLAY DEVICE

(71) Applicant: LG DISPLAY CO., LTD., Seoul (KR)

(72) Inventor: Taeyoung Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/033,465

(22) Filed: Jan. 21, 2025

(65) Prior Publication Data

US 2025/0273165 A1 Aug. 28, 2025

(30) Foreign Application Priority Data

Feb. 28, 2024 (KR) ........................ 10-2024-0029000

(51) Int. Cl.
*G09G 3/3266* (2016.01)
*G09G 3/00* (2006.01)
*G09G 3/3233* (2016.01)
*H10K 59/131* (2023.01)

(52) U.S. Cl.
CPC ......... *G09G 3/3266* (2013.01); *G09G 3/3233* (2013.01); *G09G 3/035* (2020.08); *G09G 2300/0819* (2013.01); *G09G 2300/0861* (2013.01); *G09G 2310/0286* (2013.01); *G09G 2310/06* (2013.01); *G09G 2320/0233* (2013.01); *G09G 2330/023* (2013.01); *H10K 59/131* (2023.02)

(58) Field of Classification Search
None
See application file for complete search history.

(56) References Cited

U.S. PATENT DOCUMENTS

2021/0012711 A1* 1/2021 Huang ................. G09G 3/3291

* cited by examiner

*Primary Examiner* — Aneeta Yodichkas
(74) *Attorney, Agent, or Firm* — Morgan, Lewis & Bockius LLP

(57) ABSTRACT

A display device includes: a display panel including pixels, data lines and gate lines; a data driver connected to the data lines; and a gate driver connected to the gate lines, wherein the gate driver is configured to adjust a magnitude of a voltage to be applied to a gate electrode of a transistor of the pixels, based on a low-potential driving voltage of a light-emitting element of the pixels in the display panel.

11 Claims, 8 Drawing Sheets

FIG. 6

<table>
<tr><td>Luminance Band</td><td>3</td><td rowspan="3">VGL Interpolation</td><td>4</td></tr>
<tr><td>VSSEL</td><td>A-7.2</td><td>A+1.0</td></tr>
<tr><td>VGL</td><td>-10.4v</td><td>XX</td></tr>
</table>

FIG. 7

| Luminance Band | 1 | 2 | 3 | 4 | 5 | 6 | 7~13 |
|---|---|---|---|---|---|---|---|
| VSSEL | A | A~0.5 | A~7.2 | A+1.0 | A+1.9 | A+2.0 | A+2.3 |
| VGL | Variable based on luminance | | | | | | |

DISPLAY DEVICE

CROSS-REFERENCE TO RELATED APPLICATION

This application claims priority from Korean Patent Application No. 10-2024-0029000, filed on Feb. 28, 2024 in the Korean Intellectual Property Office, and all the benefits accruing therefrom under 35 U.S.C. 119, the entire contents of which are herein incorporated by reference.

BACKGROUND

Field

The present disclosure relates to a display device.

Description of Related Art

Recently, the most widely developed display devices include a liquid crystal display LCD device, an organic light-emitting diode OLED display device, and a quantum dot light-emitting diode QLED display device.

Among these display devices, a display panel of the liquid crystal display device does not have a self-light-emitting means.

Accordingly, the liquid crystal display device requires a separate backlight that supplies light to the display panel. In this regard, a light-emitting diode LED is used as a light source of the backlight.

The OLED and QLED display devices respectively have OLED and QLED that emit light on their own, and thus do not require a separate backlight, and thus have a fast response speed, high luminous efficiency, luminance, and large viewing angle.

SUMMARY

A light-emitting element of a display device has a problem in that unnecessary power is consumed because a constant voltage is not supplied to a gate electrode of a transistor in a pixel circuit due to luminance change.

Accordingly, the inventor of the present disclosure has invented a display device capable of preventing or reducing the unnecessary power consumption by applying a variable gate-on voltage varying based on the luminance to the gate electrode of the transistor.

Thus, a technical purpose according to an embodiment of the present disclosure is to provide a display device capable of variably adjusting the gate-on voltage based on the luminance so that the light-emitting element in the pixel circuit emits light.

Another technical purpose according to an embodiment of the present disclosure is to provide a display device capable of variably adjusting the gate-on voltage based on a low-potential driving voltage to the light-emitting element.

Purposes according to the present disclosure are not limited to the above-mentioned purposes. Other purposes and advantages according to the present disclosure that are not mentioned may be understood based on following descriptions and may be more clearly understood based on embodiments according to the present disclosure. Further, it will be easily understood that the purposes and advantages according to the present disclosure may be realized using means shown in the claims or combinations thereof.

To achieve these and other advantages and in accordance with the purposes of the disclosure, as embodied and broadly described herein, a display device according to an embodiment of the present disclosure includes: a display panel including pixels, data lines and gate lines; a data driver connected to the data lines; and a gate driver connected to the gate lines, wherein the gate driver is configured to adjust a magnitude of a voltage to be applied to a gate electrode of a transistor of the pixels, based on a low-potential driving voltage of a light-emitting element of the pixels in the display panel.

In the display device according to embodiments of the present disclosure, the gate-on voltage variably adjusted based on the luminance of the pixel is applied to the gate electrode of the transistor of the pixel, thereby reducing the power consumption while maintaining the light emission performance, and thereby providing the display device operable under a low power level.

Furthermore, in the display device according to embodiments of the present disclosure, the gate-on voltage variably adjusted based on the luminance band of the pixel is applied to the gate electrode of the transistor of the pixel, thereby reducing the power consumption while maintaining the light emission performance, and thereby providing the display device operable under a low power level.

In the display device according to example embodiments of the present disclosure, the gate-on voltage variably adjusted based on the luminance band group of the pixel is applied to the gate electrode of the transistor of the pixel, thereby reducing the power consumption while maintaining the light emission performance, and thereby providing the display device operable under a low power level.

Furthermore, according to example embodiments of the present disclosure, the display device may variably adjust the gate-on voltage to be applied to the gate electrode, based on the low-potential driving voltage and the anode reset voltage to the light-emitting element, and the voltage difference between the voltage of the gate electrode and the voltage of the source electrode of the transistor.

Furthermore, according to example embodiments of the present disclosure, the display device may increase the magnitude of the voltage to be applied to the gate electrode of the transistor as the luminance of the display panel decreases, thereby reducing the power consumption while maintaining the light emission performance, thereby providing the display device operable under a low power level.

Effects of the present disclosure are not limited to the effects mentioned above, and other effects not mentioned can be clearly understood by those skilled in the art from the description as set forth below.

In addition to the above effects, specific effects of the present disclosure are described together while describing specific details for carrying out the present disclosure.

BRIEF DESCRIPTION OF DRAWINGS

The accompanying drawings, which are included to provide a further understanding of the present disclosure and are incorporated in and constitute a part of this application, illustrate embodiments of the present disclosure and together with the description serve to explain the principles of the disclosure.

FIG. 6 is a diagram showing an example of generating a gate-on voltage based on luminance according to an embodiment of the present disclosure.

FIG. 7 is an example diagram showing a relationship between a low-potential driving voltage and the gate-on voltage based on a luminance band of a display panel according to an embodiment of the present disclosure.

DETAILED DESCRIPTION

Figure 1:
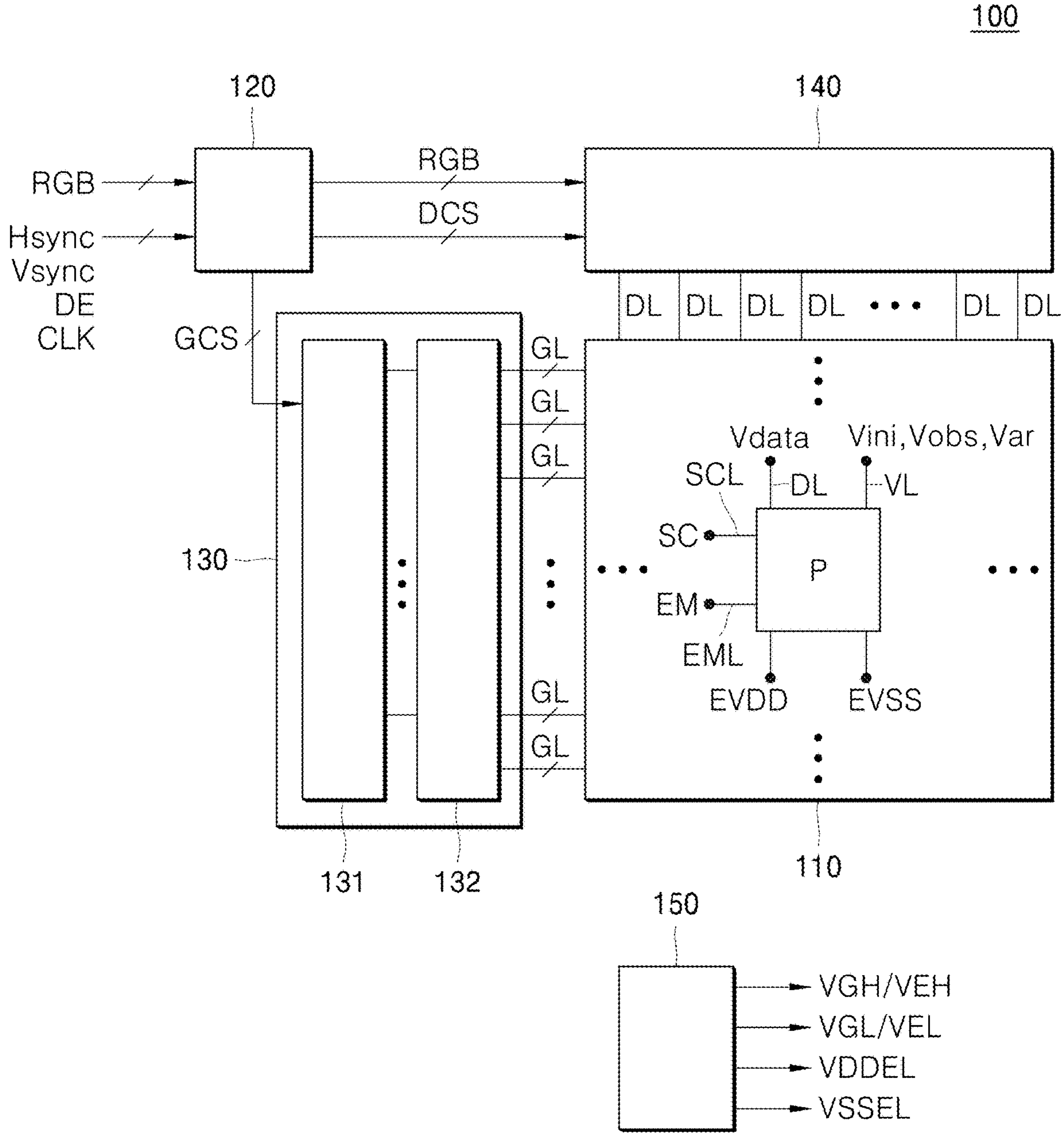
FIG. 1 is a block diagram showing a display device according to an embodiment of the present disclosure.

Advantages and features of the present disclosure, and a method of achieving the advantages and features will become apparent with reference to example embodiments described below in detail together with the accompanying drawings. However, the present disclosure is not limited to the embodiments as disclosed, but may be implemented in various different forms. Thus, these embodiments are set forth only to make the present disclosure complete, and to clearly inform the scope of the present disclosure to those of ordinary skill in the technical field to which the present disclosure belongs, and a protective scope of the present disclosure is defined by the claims and their equivalents.

For simplicity and clarity of illustration, elements in the drawings are not necessarily drawn to scale. The same reference numbers in different drawings represent the same or similar elements, and as such perform similar functionality, unless otherwise specified. Further, descriptions and details of well-known steps and elements may be omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure, including as defined by the appended claims and their equivalents.

A shape, a size, a ratio, an angle, a number, etc. disclosed in the drawings for illustrating embodiments of the present disclosure are illustrative, and the present disclosure is not limited thereto.

The terminology used herein is directed to the purpose of describing particular embodiments only and is not intended to be limiting of the present disclosure. As used herein, the singular constitutes “a” and “an” are intended to include the plural constitutes as well, unless the context clearly indicates otherwise. It will be further understood that the terms “comprise”, “comprising”, “include”, and “including” when used in this specification, specify the presence of the stated features, integers, operations, elements, and/or components, but do not preclude the presence or addition of one or more other features, integers, operations, elements, components, and/or portions thereof. As used herein, the term “and/or” includes any and all combinations of one or more of associated listed items.

Expression such as “at least one of” when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present “on” a second element or layer, the first element may be disposed directly on the second element or may be disposed indirectly on the second element with a third element or layer being disposed between the first and second elements or layers. It will be understood that when a first element or layer is referred to as being “connected to”, or “coupled to” a second element or layer, the first element may be directly connected to or coupled to the second element or layer, or one or more intervening elements or layers may be present therebetween. In addition, it will also be understood that when an element or layer is referred to as being “between” two elements or layers, it may be the only element or layer between the two elements or layers, or one or more intervening elements or layers may also be present therebetween.

In descriptions of temporal relationships, for example, temporal precedent relationships between two events such as “after”, “subsequent to”, “before”, etc., another event may occur therebetween unless a more specific relationship like “directly after”, “directly subsequent” or “directly before” is indicated.

When a certain embodiment may be implemented differently, a function or an operation specified in a specific block may occur in a different order from an order specified in a flowchart. For example, two blocks in succession may be performed substantially concurrently, or the two blocks may be performed in a reverse order depending on a function or operation involved.

It will be understood that, although the terms “first”, “second”, “third”, and so on may be used herein to describe various elements, components, regions, layers, and/or periods, these elements, components, regions, layers, and/or periods should not be limited by these terms. These terms are used to refer one element, component, region, layer, or section separately from another element, component, region, layer, or section. Thus, a first element, component, region, layer, or section as described under could be termed a second element, component, region, layer, or section, and vice versa, without departing from the spirit and scope of the present disclosure.

When an embodiment may be implemented differently, functions or operations specified within a specific block may be performed in a different order from an order specified in a flowchart. For example, two consecutive blocks may be performed substantially simultaneously, or the blocks may be performed in a reverse order depending on related functions or operations.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range even if there is no separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects", and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description as set forth below have been selected as being general and universal in the related technical field. However, there may be other terms than the terms depending on the development and/or change of technology, convention, preference of technicians, etc. Therefore, the terms used in the description as set forth below should not be understood as limiting technical ideas, but should be understood as examples of the terms for illustrating embodiments.

Further, in a specific case, a term may be arbitrarily selected by the applicant, and in this case, the detailed meaning thereof will be described in a corresponding description period. Therefore, the terms used in the description as set forth below should be understood based on not simply the name of the terms, but the meaning of the terms and the contents throughout the Detailed Description.

In description of flow of a signal, for example, when a signal is delivered from a node A to a node B, this may include a case where the signal is transferred from the node A to the node B via another node unless a more limiting phrase like 'immediately transferred' or 'directly transferred' is used.

Throughout the present disclosure, "A and/or B" means A, B, or A and B, unless otherwise specified, and "C to D" means C inclusive to D inclusive unless otherwise specified.

Hereinafter, a display device according to example embodiments of the present disclosure is described with reference to the attached drawings. In describing an embodiment, descriptions of components in a corresponding embodiment identical with or similar to those of previous embodiments may be omitted.

FIG. 1 is a block diagram showing a display device according to an example embodiment of the present disclosure.

As shown in FIG. 1, a display device 100 according to an example embodiment of the present disclosure may include a display panel 110, a timing controller 120, a gate driver 130, a data driver 140, and a power supply 150.

A configuration of the display device 100 illustrated in FIG. 1 is an example according to an embodiment, and the components of the display device 100 are not limited to the embodiment illustrated in FIG. 1, and some components may be added, changed, or deleted as needed.

Figure 2:
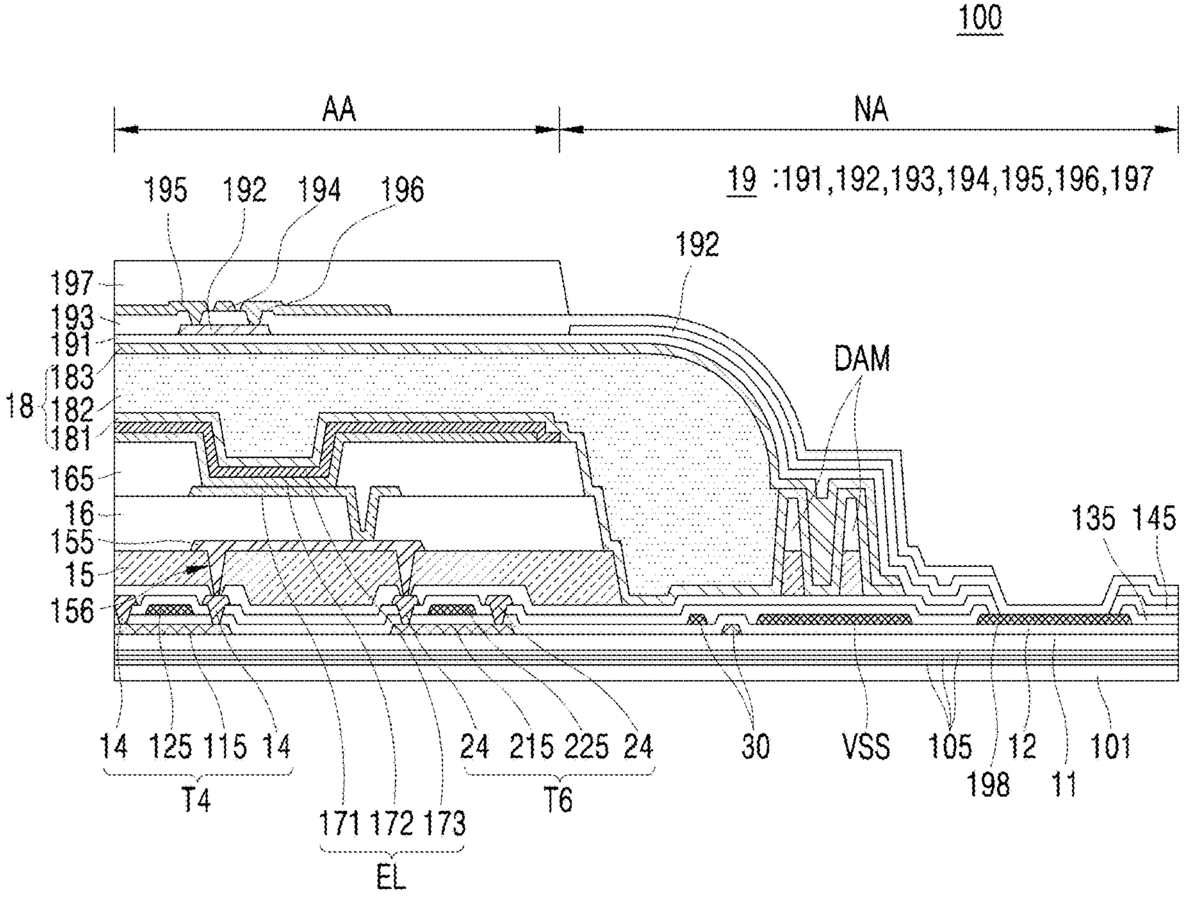
FIG. 2 is a cross-sectional diagram showing a display device according to an embodiment of the present disclosure.

According to an example embodiment, the display panel 110 may include a display area AA of FIG. 2 and a non-display area (NA of FIG. 2). At least one pixel P may be disposed in the display area (AA of FIG. 2). The non-display area (NA of FIG. 2) may surround the display area. The gate driver 130 and the data driver 140 may be disposed in the non-display area NA of FIG. 2.

According to an example embodiment, a plurality of gate lines GL and a plurality of data lines DL may be included in the display panel 110. Each of a plurality of pixels P in the display panel 110 may be connected to the gate line GL and the data line DL. The plurality of gate lines GL and the plurality of data lines DL may extend to intersect each other.

The gate driver 130 may be configured to supply a gate signal to each of the plurality of pixels P. The data driver 140 may supply a data signal to each of the plurality of pixels P. The power supply 150 may be configured to supply power for driving the display panel or each of the plurality of pixels P thereto.

For example, each pixel P may receive the gate signal from the gate driver 130 through the gate line GL and the data signal from the data driver 140 through the data line DL. In addition, each pixel P may receive a high-potential driving voltage VDDEL and a low-potential driving voltage VSSEL from the power supply 150.

Furthermore, a scan signal SC and a light-emission control signal EM may be transmitted to the display panel 110 through the gate line GL. A data voltage Vdata may be transmitted to the display panel 110 through the data line DL.

Furthermore, according to various embodiments, the gate lines GL may include a plurality of scan lines transmitting the scan signal SC and a light-emission control signal line transmitting the light-emission control signal EM. Furthermore, the plurality of pixels P may additionally include a power line VL to receive a bias voltage Vobs and an initialization voltage Var and Vini.

Figure 3:
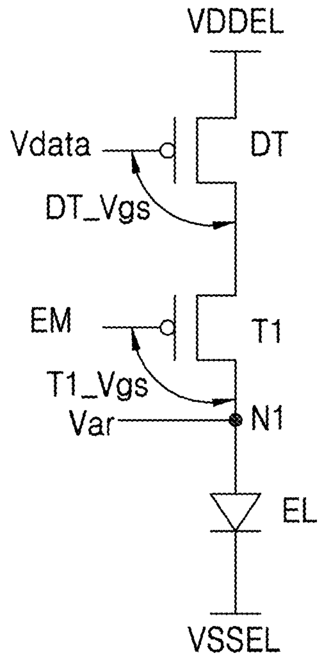
FIG. 3 is an example circuit diagram showing a pixel of a display panel according to an embodiment of the present disclosure.

Furthermore, as illustrated in FIG. 3, each pixel P may include a light-emitting element EL and a pixel circuit that controls an operation of the light-emitting element EL. The light-emitting element EL may be composed of an anode electrode, a cathode electrode, and a light-emitting layer between the anode electrode and the cathode electrode, as illustrated in FIG. 2. However, embodiments of the present disclosure are not limited thereto.

According to an example embodiment, the pixel circuit may include a plurality of switching elements, a driving element, and a capacitor. However, embodiments of the present disclosure are not limited thereto. Each of the switching element and the driving element may be embodied as a thin-film transistor. In the pixel circuit, the driving element may control an amount of current supplied to the light-emitting element EL based on a data voltage to adjust an amount of light emission of the light-emitting element EL.

Furthermore, each of the plurality of switching elements may receive the scan signal SC supplied through each of the plurality of scan lines and the light-emission control signal EM supplied through the light-emission control signal line and switch the pixel circuit based on the scan signal and the light-emission control signal. The light-emission control signal EM may be referred to as a 'light-emission signal EM'.

According to an example embodiment, the display panel 110 may be embodied as a non-transmissive display panel or a transmissive display panel. The transmissive display panel may be applied to a transparent display device where an image is displayed on a screen and a real object in a background is visible to a viewer in front of the display device. The display panel 110 may be manufactured as a flexible display panel. However, embodiments of the present disclosure are not limited thereto. The flexible display panel may be embodied as an OLED panel using a plastic substrate. However, embodiments of the present disclosure are not limited thereto.

According to an example embodiment, the pixels P may include a red pixel, a green pixel, and a blue pixel to emit light of corresponding colors. However, embodiments of the present disclosure are not limited thereto. The pixels P may further include a white pixel. Each of the pixels P may include a pixel circuit.

According to an example embodiment, a touch unit or touch sensors may be disposed on the display panel 110. Touch input may be sensed using separate touch sensors or may be sensed through the pixels P. The touch sensors may be disposed on the screen of the display panel in an on-cell type or add-on type or may be embodied as in-cell type touch sensors built into the display panel 110. However, embodiments of the present disclosure are not limited thereto.

According to an example embodiment, the timing controller 120 may be configured to process image data RGB input from an external source such as a host system so as to be adapted to a size and a resolution of the display panel 110 and to supply the processed image data to the data driver 140. The timing controller 120 may be configured to generate a gate control signal GCS and a data control signal DCS based on synchronization signals, for example, a dot clock signal CLK, a data enable signal DE, a horizontal synchronization signal Hsync, and a vertical synchronization signal Vsync input from the external source.

The timing controller 120 may be configured to supply the generated gate control signal GCS and data control signal DCS to the gate driver 130 and the data driver 140, respectively, thereby controlling the gate driver 130 and the data driver 140.

According to an example embodiment, the timing controller 120 may be configured to be configured to be coupled to various processors, for example, a microprocessor, a mobile processor, an application processor, etc., depending on a type of a device on which the controller is mounted. However, embodiments of the present disclosure are not limited thereto.

According to an example embodiment, the host system may be any one of a television (TV) system, a set top box, a navigation system, a personal computer (PC), a home theater system, a mobile device, a wearable device, and a vehicle system. However, embodiments of the present disclosure are not limited thereto.

According to an example embodiment, the timing controller 120 multiplies an input frame frequency by i and controls an operation timing of each of the gate driver 130 and the data driver 140 using a frame frequency=the input frame frequency×i (i is a positive integer greater than 0) Hz. The input frame frequency is 60 Hz in the National Television Standards Committee (NTSC) scheme and is 50 Hz in the Phase-Alternating Line (PAL) scheme. However, embodiments of the present disclosure are not limited thereto.

According to an example embodiment, the timing controller 120 may be configured to generate and output a signal so that the pixel may operate at various refresh rates. That is, the timing controller 120 may be configured to generate and output operation-related signals such that the pixel may operate in a Variable Refresh Rate (VRR) mode or a refresh rate thereof may be switchable to between a first refresh rate and the second refresh rate.

For example, the timing controller 120 may be configured to simply change a rate of a clock signal, to generate a synchronization signal to generate a horizontal blank or a vertical blank, or to operate the gate driver 130 in a mask manner such that the pixel P may operate at various refresh rates.

According to an example embodiment, the timing controller 120 may be configured to control the data driver 140 and the gate driver 130. The timing controller 120 may be configured to control output at least one scan signal to the gate driver 130 while the display panel 110 operates in an AoD (Always on Display) mode in which the display panel operates at a low frequency (e.g., 1 Hz).

According to an example embodiment, the gate driver 130 may be configured to include a light-emission driver 131 and a scan driver 132.

According to an example embodiment, the gate driver 130 may be configured to supply the scan signal SC to the gate line GL based on the gate control signal GCS supplied from the timing controller 120. The gate driver 130 may be disposed at one side or each of both opposing sides of the display panel 110 in a GIP (Gate In Panel) manner. However, embodiments of the present disclosure are not limited thereto.

According to an example embodiment, the gate driver 130 may be configured to sequentially output the gate signal to the plurality of gate lines GL under control of the timing controller 120. The gate driver 130 may be configured to shift the gate signal using a shift register and sequentially supply the shifted gate signal to the gate lines GL.

For example, the gate signal may include the scan signal SC and the light-emission control signal EM in the display device. The scan signal SC may include a scan pulse swinging between a gate on voltage VGL and a gate off voltage VGH. The light-emission control signal EM may include a light-emission control signal pulse that swings between the gate on voltage VEL and the gate off voltage VEH.

The scan pulse may be synchronized with the data voltage Vdata to select pixels P of a line to which data is to be written. The light-emission control signal EM may define a light-emission time of each of the pixels P.

According to an example embodiment, the gate driver 130 may be configured to include a light-emission driver that outputs the light-emission control signal EM and a scan driver that outputs at least one scan signal SC.

For example, the light-emission driver may output the light-emission control signal pulse in response to a start pulse and a shift clock from the timing controller 120, and may sequentially shift a pulse of the light-emission control signal according to the shift clock.

For example, at least one scan driver may output a scan pulse in response to a start pulse and a shift clock from the timing controller 120, and may shift the scan pulse according to the shift clock timing.

According to an example embodiment, the data driver 140 may convert the image data RGB into the data voltage Vdata based on the data control signal DCS supplied from the timing controller 120, and supply the converted data voltage Vdata to the pixel P through the data line DL.

According to an example embodiment, the power supply 150 may be configured to generate DC power to drive a pixel array of the display panel 110 and the display panel driver including the gate driver and the data driver using a DC-DC converter. The DC-DC converter may include a charge pump, a regulator, a buck converter, a boost converter, etc. However, embodiments of the present disclosure are not limited thereto. The power supply 150 may be configured to receive a DC input voltage applied from the host system and generate a DC voltage such as the gate-on voltage VGL and VEL, the gate-off voltage VGH and VEH, the high-potential driving voltage VDDEL, and the low-potential driving voltage VSSEL. The gate-on voltage VGL and VEL and the gate-off voltage VGH and VEH may be supplied to the level shifter and the gate driver 130. Each of the high-potential driving voltage VDDEL and the low-potential driving voltage VSSEL may be commonly supplied to the pixels P.

FIG. 2 is a cross-sectional view showing a display device according to an embodiment of the present disclosure.

As shown in FIG. 2, the display device 100 according to an embodiment of the present disclosure may have a fourth transistor T4 disposed on a substrate 101. The fourth transistor T4 may include a fourth semiconductor layer 115, a fourth gate electrode 125, and source and drain electrodes 24 referred to as a first electrode and a second electrode thereof, respectively. The substrate 101 may include the display area AA and the non-display area NA. The display area AA may display an image. The non-display area NA may be disposed around the display area AA or surround the display area AA. The fourth transistor T4 may act as a light-emission transistor for driving a light-emitting element EL in the display area AA. However, embodiments of the present disclosure are not limited thereto.

According to an example embodiment of the present disclosure, the display device 100 may have a sixth transistor T6 disposed on the substrate 101.

The sixth transistor T6 may include a sixth semiconductor layer 215, a sixth gate electrode 225, and source and drain electrodes 24 referred to as a first electrode and a second electrode thereof, respectively. The sixth transistor T6 may act as a reset transistor for resetting an anode electrode of a light-emitting element EL in the display area AA. However, embodiments of the present disclosure are not limited thereto.

For convenience of illustration, only the fourth transistor T4 and the sixth transistor T6 among various thin-film transistors that may be included in the display device 100 are illustrated. However, another thin-film transistor acting as a switching transistor may be included in the display device 100. Furthermore, an example in which the thin-film transistor has a coplanar structure is described. However, the thin-film transistor may be implemented to have other structures such as a staggered structure. However, embodiments of the present disclosure are not limited thereto.

According to an example embodiment, the fourth transistor T4 may receive the high-potential driving voltage EVDD in response to the light-emission control signal EM supplied to the fourth gate electrode 125 thereof and control the current to be supplied to the light-emitting element EL, based on the received high-potential driving voltage EVDD, thereby controlling the light-emitting amount of the light-emitting element EL. The fourth transistor T4 may allow a constant current to be supplied to the light-emitting element EL using a voltage charged in the storage capacitor Cst until a data signal of a next frame is supplied thereto, such that the light-emitting element EL may maintain the light-emission state. A high-voltage supply line may extend in a parallel manner to the data line. However, embodiments of the present disclosure are not limited thereto.

According to an example embodiment, the sixth transistor T6 may receive a reset voltage signal Var in response to the light-emission control signal EM supplied to the sixth gate electrode 225 thereof and transmit the reset voltage signal to an anode electrode N5 as a first electrode of the light-emitting element EL, thereby causing the anode electrode of the light-emitting element EL to be reset.

According to an example embodiment, the fourth transistor T4 may include the fourth semiconductor layer 115, the fourth gate electrode 125, and the source and drain electrodes 14, as illustrated in FIG. 2. When the first electrode of the fourth transistor T4 is a source electrode, the second electrode may be a drain electrode. Alternatively, when the first electrode thereof is a drain electrode, the second electrode thereof may be a source electrode. The fourth semiconductor layer 115 may be disposed on a first insulating layer 11. A second insulating layer 12 may be disposed on the fourth semiconductor layer 115. The fourth gate electrode 125 may be disposed on the second insulating layer 12. The fourth gate electrode 125 may overlap the fourth semiconductor layer 115. For example, the fourth gate electrode 125 may overlap the fourth semiconductor layer 115 while the second insulating layer 12 is interposed therebetween. The source and drain electrodes 14 may be disposed on a third insulating layer 135. The source and drain electrodes 14 may be in contact with the fourth semiconductor layer 115. The fourth transistor T4 may include a P-type MOS thin-film transistor (P-MOSFET) or a low-temperature polycrystalline silicon (LTPS) thin-film transistor. However, embodiments of the present disclosure are not limited thereto.

According to an example embodiment, the sixth transistor T6 may have the sixth semiconductor layer 215, the sixth gate electrode 225, and the source and drain electrodes 24 as shown in FIG. 2. In the sixth transistor T6, when the first electrode is the source electrode, the second electrode may be the drain electrode. Alternatively, when the first electrode is the drain electrode, the second electrode may be the source electrode. The sixth semiconductor layer 215 may be disposed on the first insulating layer 11. The sixth gate electrode 225 may be disposed on the second insulating layer 12. The sixth gate electrode 225 may overlap the sixth semiconductor layer 215. For example, the sixth gate electrode 225 may overlap the sixth semiconductor layer 215 while the second insulating layer 12 is interposed therebetween. The source and drain electrodes 24 may be disposed on the third insulating layer 135. The source and drain electrodes 24 may be in contact with the sixth semiconductor layer 215. The sixth transistor T6 may include an N-type MOS thin-film transistor (N-MOSFET) or an oxide thin-film transistor. However, embodiments of the present disclosure are not limited thereto.

According to an example embodiment, each of the fourth semiconductor layer 115 and the sixth semiconductor layer 215 may be an area where a channel is formed when the thin-film transistor (TFT) operates. Each of the fourth semiconductor layer 115 and the sixth semiconductor layer 215 may be made of an oxide semiconductor, or may be made of each of various organic semiconductors such as amorphous silicon (a-Si), polycrystalline silicon (poly-Si), low-temperature polycrystalline silicon (LTPS), or pentacene. However, embodiments of the present disclosure are not limited thereto. The fourth semiconductor layer 115 and the sixth semiconductor layer 215 may be disposed on the first insulating layer 11. Each of the fourth semiconductor layer 115 and the sixth semiconductor layer 215 may include the channel area, a source area, and a drain area. The channel area of the fourth semiconductor layer 115 may overlap the fourth gate electrode 125 while the first insulating layer 11 is interposed therebetween and may be disposed between the source and drain electrodes 14. The channel area of the sixth semiconductor layer 215 may overlap the sixth gate electrode 225 while the first insulating layer 11 is interposed therebetween and may be disposed between the source and drain electrodes 24. The source area of the fourth semiconductor layer 115 may be electrically connected to the source electrode 14 via a contact hole extending through the second insulating layer 12 and the third insulating layer 135. The source area of the sixth semiconductor layer 215 may be electrically connected to the source electrode 24 via a contact hole extending through the second insulating layer 12 and the third insulating layer 135. The drain area of the fourth semiconductor layer 115 may be electrically connected to the drain electrode 14 through a contact hole extending through the second insulating layer 12 and the third insulating layer 135. The drain area of the sixth semiconductor layer 215 may be electrically connected to the drain electrode 24 through a contact hole extending through the second insulating layer 12 and the third insulating layer 135. A buffer layer 105 and the first insulating layer 11 may be disposed between each of the fourth semiconductor layer 115 and the sixth semiconductor layer 215 and the substrate 101. The buffer layer 105 may delay the diffusion of moisture and/or oxygen that has penetrated into the substrate 101. The first insulating layer 11 protects the fourth semiconductor layer 115 and the sixth semiconductor layer 215 and may block various types of defects introduced from the substrate 101.

According to an example embodiment, the uppermost layer of the buffer layer 105 in contact with the first insulating layer 11 may be made of a material having different etching characteristics from those of each of the remaining layers of the buffer layer 105, the first insulating layer 11, the second insulating layer 12 and the third insulating layer 135. However, embodiments of the present disclosure are not limited thereto. The uppermost layer of the buffer layer 105 contacting the first insulating layer 11 may be made of one of silicon nitride ($SiN_x$) and silicon oxide ($SiO_x$). However, embodiments of the present disclosure are not limited thereto. Each of the remaining layers of the buffer layer 105, the first insulating layer 11, the second insulating layer 12, and the third insulating layer 135 may be made of the other of silicon nitride ($SiN_x$) and silicon oxide ($SiO_x$). However, embodiments of the present disclosure are not limited thereto. For example, the uppermost layer of the buffer layer 105 in contact with the first insulating layer 11 may be made of silicon nitride ($SiN_x$), while each of the remaining layers of the buffer layer 105, the first insulating layer 11, the second insulating layer 12, and the third insulating layer 135 may be made of silicon oxide ($SiO_x$). However, embodiments of the present disclosure are not limited thereto.

According to an example embodiment, the fourth gate electrode 125 and the sixth gate electrode 225 may be formed on the second insulating layer 12. The fourth gate electrode 125 and the sixth gate electrode 225 may respectively overlap the channel areas of the fourth semiconductor layer 115 and the sixth semiconductor layer 215 while the second insulating layer 12 is interposed therebetween. Each of the fourth gate electrode 125 and the sixth gate electrode 225 may be made of a first conductive material and may be embodied as a single layer or multi-layers made of magnesium (Mg), molybdenum (Mo), aluminum (Al), chromium (Cr), gold (Au), titanium (Ti), nickel (Ni), neodymium (Nd), copper (Cu), or an alloy thereof. However, embodiments of the present disclosure are not limited thereto.

According to an example embodiment, the source electrode 14 may be connected to the exposed source area of the fourth semiconductor layer 115 via the contact hole extending through the second insulating layer 12 and the third insulating layer 135. The source electrode 24 may be connected to the exposed source area of the sixth semiconductor layer 215 via the contact hole extending through the second insulating layer 12 and the third insulating layer 135. The drain electrode 14 may be opposite to the source electrode 14 and may be connected to the drain area of the fourth semiconductor layer 115 via the contact hole extending through the second insulating layer 12 and the third insulating layer 135. The drain electrode 24 may be opposite to the source electrode 24 and may be connected to the drain area of the sixth semiconductor layer 215 via the contact hole extending through the second insulating layer 12 and the third insulating layer 135. Each of the source and drain electrodes 14 and 24 may be made of a second conductive material and may be embodied as a single layer or multi-layers made of molybdenum (Mo), aluminum (Al), chromium (Cr), gold (Au), titanium (Ti), nickel (Ni), neodymium (Nd), copper (Cu), or an alloy thereof. However, embodiments of the present disclosure are not limited thereto.

According to an example embodiment, a connection electrode 155 may be disposed between a first middle layer 15 and a second middle layer 16. The connection electrode 155 may be connected to each of the drain electrodes 14 and 24 via a connection electrode contact hole 156 extending through a protective film 145 and the first middle layer 15. The connection electrode 155 may be made of a material having low resistivity and identical to or similar to that of each of the drain electrodes 14 and 24. However, embodiments of the present disclosure are not limited thereto.

As shown in FIG. 2, a light-emitting element EL including a light-emitting layer 172 may be disposed on the second middle layer 16 and a bank layer 165. The light-emitting element EL may include an organic electroluminescent diode. However, embodiments of the present disclosure are not limited thereto. For example, the light-emitting element EL may include an inorganic light-emitting element, a quantum dot element, a micro LED element, or a mini LED element. However, embodiments of the present disclosure are not limited thereto. In the light-emitting element EL, the first electrode may be an anode electrode, and the second electrode may be a cathode electrode.

According to an example embodiment, the light-emitting element EL may include an anode electrode 171, at least one light-emitting layer 172 formed on the anode electrode 171, and a cathode electrode 173 formed on the light-emitting layer 172.

According to an example embodiment, the anode electrode 171 may be electrically connected to an exposed portion of the connection electrode 155 disposed on the first middle layer 15 and facing the second middle layer 16 via a contact hole extending through the second middle layer 16.

According to an example embodiment, the anode electrode 171 of each pixel may not be covered with the bank layer 165 so as to be exposed. The bank layer 165 may be made of an opaque material (e.g., black) to prevent or reduce light interference between adjacent pixels. In this case, the bank layer 165 may include a light-shielding material including at least one of color pigment, organic black, and carbon black. However, embodiments of the present disclosure are not limited thereto. The bank layer 165 may be made of a material including a black pigment, or an organic material such as a benzocyclobutene resin, a polyimide resin, an acryl resin, or a photosensitive polymer. However, embodiments of the present disclosure are not limited thereto. When the bank layer 165 is made of a material including a black pigment or a black dye, the bank layer may be a black bank layer. When the bank layer 165 is made of a material including a black pigment or a black dye, the bank layer may block light from the outside or light reflected from the outside, so that the luminance of the display device may be further improved. A spacer may be further disposed on the bank layer 165. The spacer may be made of the same material as that of the bank layer 165. However, embodiments of the present disclosure are not limited thereto.

As shown in FIG. 2, the at least one light-emitting layer 172 may be formed on a portion of the anode electrode 171 corresponding to a light-emitting area defined by the bank layer 165. The at least one light-emitting layer 172 may include a hole transport layer, a hole injection layer, a hole blocking layer, a light-emitting layer 172, an electron injection layer, an electron blocking layer, and an electron transport layer on the anode electrode 171. A stacking order of the hole transport layer, the hole injection layer, the hole blocking layer, the light-emitting layer 172, the electron injection layer, the electron blocking layer, and the electron transport layer may be based on a light-emitting direction. However, embodiments of the present disclosure are not limited thereto. In addition, the light-emitting layer 172 may include first and second light-emitting stacks facing each other while a charge generating layer is interposed therebetween. In this case, the light-emitting layer 172 of one of the first and second light-emitting stacks may generate blue light, while the light-emitting layer 172 of the other of the first and second light-emitting stacks may generate yellow-green light, so that white light may be generated from a combination of the first and second light-emitting stacks. However, embodiments of the present disclosure are not limited thereto. The white light generated from the combination of the first and second light-emitting stacks may be incident on a color filter positioned above or below the light-emitting layer 172, such that a color image may be realized. In another example, each light-emitting layer 172 may generate each color light corresponding to each pixel without a separate color filter such that a color image may be rendered. For example, the light-emitting layer 172 of a red (R) pixel emits red light, the light-emitting layer 172 of a green (G) pixel emits green light, and the light-emitting layer 172 of a blue (B) pixel emits blue light.

As shown in FIG. 2, the cathode electrode 173 may be formed to face the anode electrode 171 while the light-emitting layer 172 is disposed therebetween, and may receive the high-potential driving voltage EVDD.

According to an example embodiment, an encapsulation stack or encapsulation layer 18 may block penetration of external moisture or oxygen into the light-emitting element EL that is vulnerable to external moisture or oxygen. To this end, the encapsulation layer 18 may include at least one inorganic encapsulation layer and at least one organic encapsulation layer. However, embodiments of the present disclosure are not limited thereto. In the present disclosure, a structure of the encapsulation layer 18 in which a first encapsulation layer 181, a second encapsulation layer 182, and a third encapsulation layer 183 are sequentially stacked is described by way of example. However, embodiments of the present disclosure are not limited thereto.

According to an example embodiment, the first encapsulation layer 181 may be formed on the substrate 101 on which the cathode electrode 173 has been formed. The third encapsulation layer 183 may be formed on the substrate 101 on which the second encapsulation layer 182 has been formed. The third encapsulation layer 183 and the first encapsulation layer 181 may surround a top face, a bottom face, and a side face of the second encapsulation layer 182. The first encapsulation layer 181 and the third encapsulation layer 183 may reduce, minimize, or prevent penetration of external moisture or oxygen into the light-emitting element EL. Each of the first encapsulation layer 181 and the third encapsulation layer 183 may be made of an inorganic insulating material that may be deposited at a low temperature, such as silicon nitride ($SiN_x$), silicon oxide ($SiO_x$), silicon oxynitride (SiON), or aluminum oxide ($Al_2O_3$). However, embodiments of the present disclosure are not limited thereto. Each of the first encapsulation layer 181 and the third encapsulation layer 183 is deposited in a low temperature atmosphere. Thus, during a deposition process of the first encapsulation layer 181 and the third encapsulation layer 183, the light-emitting element EL which is vulnerable to a high-temperature atmosphere may be prevented from being damaged.

According to an example embodiment, the second encapsulation layer 182 serves as a shock-absorbing layer to relieve a stress between layers due to bending of the display device 100, and may planarize a step between layers. The second encapsulation layer 182 may be made of a non-photosensitive organic insulating material such as acryl resin, epoxy resin, phenolic resin, polyamide resin, polyimide resin, polyethylene, or silicon oxycarbon (SiOC) or a photosensitive organic insulating material such as photoacryl. However, embodiments of the present disclosure are not limited thereto. When the second encapsulation layer 182 is formed using an inkjet method, a dam may be disposed to prevent the second encapsulation layer 182 in a liquid state from spreading to an edge of the substrate 101. The dam DAM may be closer to the edge of the substrate 101 than the second encapsulation layer 182 may be. The dam DAM may prevent the second encapsulation layer 182 in the liquid state from spreading to a pad area where a conductive pad disposed at the outermost side of the substrate 101 is disposed.

According to an example embodiment, the dam DAM is designed to prevent or reduce diffusion of the second encapsulation layer 182. However, when the second encapsulation layer 182 overflows the dam DAM during a process, the second encapsulation layer 182 as an organic layer may be exposed to an outside, so that moisture or the like may invade the light-emitting element. Therefore, to prevent or reduce the invasion, at least two dams DAM may be stacked. However, embodiments of the present disclosure are not limited thereto.

As shown in FIG. 2, the dam DAM may be disposed on the protective film 145 and in the non-display area NA.

Further, the dam DAM, and the first middle layer 15 and the second middle layer 16 may be formed simultaneously. However, embodiments of the present disclosure are not limited thereto. The first middle layer 15, and a lower layer of the dam DAM may be formed simultaneously. The second middle layer 16, and an upper layer of the dam DAM may be formed simultaneously. Thus, the dam DAM may have a double layer structure. However, embodiments of the present disclosure are not limited thereto.

Accordingly, the dam DAM may be made of the same material as that of each of the first middle layer 15 and the second middle layer 16. However, embodiments of the present disclosure are not limited thereto.

As shown in FIG. 2, the dam DAM may overlap the low-potential driving power line VSS. For example, the low-potential driving power line VSS may be formed in a layer under the dam DAM and in the non-display area NA.

According to an example embodiment, the low-potential driving power line VSS and a gate driver 30 in a form of a gate in panel (GIP) may surround a periphery of the display panel. The low-potential driving power line VSS may be located outwardly of the gate driver 30. Further, the low-potential driving power line VSS may be connected to the anode electrode 171 to apply a common voltage thereto. The gate driver 30 is simply illustrated in plan and cross-sectional views. However, the gate driver 30 may be configured using a thin-film transistor (TFT) having the same structure as that of the thin-film transistor (TFT) of the display area AA. However, embodiments of the present disclosure are not limited thereto.

As shown in FIG. 2, the low-potential driving power line VSS may be disposed outwardly of the gate driver 30. The low-potential driving power line VSS may be disposed outwardly of the gate driver 30 and may surround the display area AA. The low-potential driving power line VSS may be made of the same material as that of each of the source and drain electrodes 14 and 24 of the fourth and sixth thin-film transistors T4 and T6. However, embodiments of the present disclosure are not limited thereto. For example, the low-potential driving power line VSS may be made of the same material as that of each of the fourth gate electrode 125 and the sixth gate electrode 225. However, embodiments of the present disclosure are not limited thereto.

Further, the low-potential driving power line VSS may be electrically connected to the anode electrode 171. Alternatively, the low-potential driving power line VSS may be electrically connected to the cathode electrode 173. The low-potential driving power line VSS may supply the low-potential driving voltage EVSS to the plurality of pixels in the display area AA.

According to an embodiment, a touch layer 19 may be disposed on the encapsulation layer 18. In the touch layer 19, a buffer film 191 may be positioned between a touch sensor metal including touch connection electrodes 192 and 194 and touch electrodes 195 and 196 and the cathode electrode 173 of the light-emitting element EL.

According to an embodiment, the buffer film 191 may prevent chemical (developer, etchant, etc.) used in a manufacturing process of the touch sensor metal disposed on the buffer film 191 or moisture from the outside from invading the light-emitting layer 172 including an organic material. Accordingly, the buffer film 191 may prevent or reduce damage to the light-emitting layer 172 as vulnerable to the chemicals or moisture.

According to an example embodiment, the buffer film 191 may be made of an organic insulating material that can be formed at a low temperature below or equal to a certain temperature (100 degrees Celsius) to prevent or reduce damage to the light-emitting layer 172 including the organic material vulnerable to a high temperature, and that has a low dielectric constant of 1 to 3. However, embodiments of the present disclosure are not limited thereto. For example, the buffer film 191 may be made of an acryl-based, epoxy-based, or siloxane-based material. However, embodiments of the present disclosure are not limited thereto. The buffer film 191 made of the organic insulating material and having planarization performance may prevent or reduce damage to the encapsulation layer 18 and fracture of the touch sensor metal formed on the buffer film 191 due to bending of the display device.

According to an example embodiment, based on a mutual-capacitance-based touch sensor structure, the touch electrodes 195 and 196 may be disposed on the touch buffer layer 191, and the touch electrodes 195 and 196 may be disposed to intersect each other. However, embodiments of the present disclosure are not limited thereto.

According to an example embodiment, the touch connection electrodes 192 and 194 may electrically connect the touch electrodes 195 and 196 to each other. The touch connection electrodes 192 and 194 and the touch electrodes 195 and 196 may be positioned on different layers while the touch insulating film 193 is interposed therebetween. However, embodiments of the present disclosure are not limited thereto.

According to an example embodiment, the touch connection electrodes 192 and 194 may overlap the bank layer 165, thereby preventing an aperture ratio of the display device from being lowered.

According to an example embodiment, a portion of the touch connection electrode 192 may extend along upper and side surfaces of the encapsulation layer 18 and upper and side surfaces of the dam DAM and then may be electrically connected to a touch driver circuit (not shown) via a touch pad 198. Thus, the touch electrodes 195 and 196 may be electrically connected to the touch driver circuit.

According to an example embodiment, the portion of the touch connection electrode 192 may receive a touch driving signal from the touch driver circuit and transmit the same to the touch electrodes 195 and 196, and may receive a touch sensing signal from the touch electrodes 195 and 196 and may transmit the same to the touch driver circuit.

According to an example embodiment, a protective film 197 may be disposed on the touch electrodes 195 and 196. In the drawing, it is shown that the protective film 197 is disposed only on the touch electrodes 195 and 196. However, embodiments of the present disclosure are not limited thereto. The protective film 197 may extend to an inner end or an outer end of the dam DAM and thus may also be disposed on the touch connection electrode 192.

Further, a color filter (not shown) may be further disposed on the encapsulation layer 180, and the color filter may be positioned on the touch layer 19 or between the encapsulation layer 18 and the touch layer 19. However, embodiments of the present disclosure are not limited thereto.

In FIG. 2, the display area AA of the display device 100 may be configured as follows. The buffer layer 105 may be disposed on the substrate 101 including the display area AA and the non-display area NA. The first insulating layer 11 may be disposed on the buffer layer 105. The fourth semiconductor layer 115 of the fourth transistor T4 and the sixth semiconductor layer 215 of the sixth transistor T6 may be disposed on the first insulating layer 11. The second insulating layer 12 may be disposed on the first insulating layer 11, the fourth semiconductor layer, and the sixth semiconductor layer.

According to an example embodiment, the low-potential driving power line VSS, the fourth gate electrode 125 of the fourth transistor T4, and the sixth gate electrode 225 of the sixth transistor T6 may be disposed on the second insulating layer 12. The third insulating layer 135 may be disposed on the second insulating layer 12, the low-potential driving power line VSS, the fourth gate electrode 125, and the sixth gate electrode 225. Both the fourth gate electrode 125 and the sixth gate electrode 225 may be in contact with a light-emitting signal line.

According to an example embodiment, the first electrode and the second electrode 14 of the fourth transistor T4 and the first electrode and the second electrode 24 of the sixth transistor T6 may be disposed on the third insulating layer 135. Each of the first electrode and the second electrode 14 of the fourth transistor T4 may be in contact with the fourth semiconductor layer 115 via the first contact hole, while each of the first electrode and the second electrode 24 of the sixth transistor T6 may be in contact with the sixth semiconductor layer 215 via the second contact hole. The protective film 145 may be disposed on the third insulating layer 135, the first electrode and the second electrode 14 of the fourth transistor T4, and the first electrode and the second electrode 24 of the sixth transistor T6.

According to an example embodiment, the first middle layer 15 may be disposed on the protective film 145 and in the display area AA. The connection electrode 155 may be disposed on the first middle layer 15 and in the display area AA. The connection electrode 155 may be in contact with the first electrode or the second electrode 14 of the fourth transistor T4 via the third contact hole 156 and may be in contact with the first electrode or the second electrode 24 of the sixth transistor T6 via the further third contact hole 156. The first electrode or the second electrode 14 of the fourth transistor T4 that is not connected to the connection electrode 155 may be in contact with the driving transistor. The first electrode or the second electrode 24 of the sixth transistor T6 that is not connected to the connection electrode 155 may be in contact with the reset voltage line. The second middle layer 16 may be disposed on the first middle layer 15 and the connection electrode 155 and in the display area AA.

According to an example embodiment, the first electrode 171 of the light-emitting element EL may be disposed on the second middle layer 16 and in the display area AA. The first electrode 171 of the light-emitting element EL may be in contact with the connection electrode 155 via a fourth contact hole. The bank layer 165 may be disposed on the second middle layer 16 except for the first electrode 171 of the light-emitting element EL and in the display area AA. The light-emitting layer 172 may be disposed on the bank layer 165 and the first electrode 171 of the light-emitting element EL and in the display area AA. The second electrode 173 of the light-emitting element EL may be disposed on the light-emitting layer 172 and in the display area AA. The encapsulation stack or encapsulation layer 18 may be disposed on the second electrode 173 of the light-emitting element EL and in the display area AA and on the protective film 145 in the non-display area NA.

Figure 4:
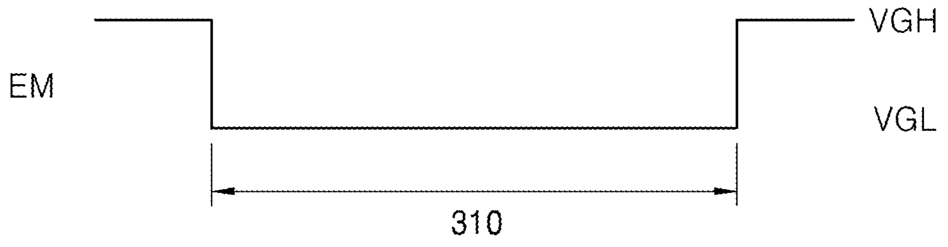
FIG. 4 is an example diagram showing a waveform of a light-emission control signal according to an embodiment of the present disclosure.

FIG. 3 is an example circuit diagram schematically showing a pixel of a display panel according to an embodiment of the present disclosure. FIG. 4 is an example diagram showing a waveform of a light-emission control signal according to an embodiment of the present disclosure.

As shown in FIG. 3 and FIG. 4, the light-emitting element EL may emit light based on driving current supplied from a driving transistor DT. A stack of organic compound layers may be formed between the anode electrode and the cathode electrode of the light-emitting element EL. The organic compound layers may include at least a hole transport layer, an electron transport layer, and a light-emitting layer. However, embodiments of the present disclosure are not limited thereto. In this regard, the hole transport layer may be a layer that injects holes or transports holes to the light-emitting layer. For example, the hole transport layer may include a hole injection layer (HIL), a hole transport layer (HTL), an electron blocking layer (EBL), etc. However, embodiments of the present disclosure are not limited thereto. The electron transport layer may be a layer that injects electrons into or transfers electrons to the light-emitting layer. For example, the electron transport layer may include an electron transport layer (ETL), an electron injection layer (EIL), a hole blocking layer (HBL), etc. However, embodiments of the present disclosure are not limited thereto. The anode electrode of the light-emitting element EL may be connected to a node N1, and the cathode electrode of the organic light-emitting element may be connected to an input terminal of the low-potential driving voltage VSSEL. The initialization voltage Var may be applied to the node N1.

According to an example embodiment, the driving transistor DT may control the driving current to be applied to the light-emitting element EL based on a gate-source voltage DT_Vgs thereof. The data voltage Vdata may be applied to a gate electrode of the driving transistor DT. A source electrode of the driving transistor DT may be connected to a transistor T1, and the high-potential driving voltage VDDEL may be applied to a drain electrode of the driving transistor DT.

According to an example embodiment, the transistor T1 may be connected to and disposed between the driving transistor DT and the node N1, and may be turned on/off based on the light-emission control signal EM. The transistor T1 may control the driving current to be applied to the light-emitting element EL based on a gate-source voltage T1_Vgs thereof. For example, depending on a luminance level of the display panel, the gate-on voltage VGL may be applied to the gate electrode of the transistor T1, and the light-emitting element EL may emit light. A gate electrode of the transistor T1 may be connected to a light-emission line to which the light-emission control signal EM is applied. In addition, a source electrode of the transistor T1 may be connected to the node N1, and a drain electrode of the transistor T1 may be connected to the driving transistor DT. The transistor T1 may be referred to as an emission transistor. However, embodiments of the present disclosure are not limited thereto. In addition, the initialization voltage Var may be applied to the first node N1.

According to an example embodiment, the light-emission control signal EM may include the gate-on voltage VGL and the gate-off voltage VGH. However, embodiments of the present disclosure are not limited thereto. As the light-emission control signal EM is applied to the gate electrode of the transistor T1, the light-emitting element EL may have been turned on or off for a predetermined period 310. For example, when the gate-on voltage VGL is applied to the gate electrode of the transistor T1, the light-emitting element EL may have been turned on for the predetermined period 310. For example, when the gate-off voltage VGH is applied to the gate electrode of the transistor T1, the light-emitting element EL may have been turned off for a predetermined period 310.

According to an example embodiment, the display panel 110 of the display device may be configured such that the low-potential driving voltage VSSEL to be supplied to the light-emitting element EL may vary based on a luminance band of the display panel 110. The varied low-potential driving voltage VSSEL may be supplied to the light-emitting element EL. Then, to maintain the light-emission of the light-emitting element EL, a constant gate-on voltage VGL may be applied to the gate electrode of the transistor T1 without considering the margin. Thus, the light-emitting element EL may be turned on based on the gate-on voltage VGL applied thereto.

According to an example embodiment, the gate driver 130 may be configured to adjust a magnitude of the voltage to be applied to the gate electrode of the transistor T1 based on the low-potential driving voltage VSSEL applied to the light-emitting element EL of the display panel 110 and apply the voltage having the adjusted magnitude to the gate electrode of the transistor T1. The gate driver 130 may be configured to adjust the magnitude of the voltage to be applied to the gate electrode of the transistor T1 based on a luminance mode or a luminance band of the display panel 110 and then apply the adjusted voltage to the gate electrode of the transistor T1.

According to an example embodiment, the gate driver 130 may be configured to operate so that the gate-on voltage VGL varying based on the luminance of the pixel is supplied to the pixel to reduce constant power consumption when the gate-on voltage VGL is generated in the power supply 150 (e.g., Power Management Integrated Circuit: PMIC).

To this end, the gate driver 130 may be configured to include a circuit that is configured to adjust the gate-on voltage VGL based on the low-potential driving voltage VSSEL in consideration of interpolation between luminance bands to supply the gate-on voltage VGL varying based on the luminance of the pixel to the pixel.

According to an example embodiment, the gate driver 130 may be configured to generate a positive voltage relative to a limit of the gate-on voltage VGL and apply the generated voltage to the gate electrode of the transistor T1.

According to an example embodiment, the power supply 150 may be configured to charge-pump a voltage input thereto to output the gate-on voltage VGL. In this regard, the gate driver 130 may be configured to allow the power supply 150 to output the gate-on voltage VGL of a low step to lower the constant power consumption.

The gate driver 130 may be configured to adjust the magnitude of the gate-on voltage VGL of the transistor T1 based on the low-potential driving voltage VSSEL of the light-emitting element EL varying based on the luminance band of the display panel 110 (e.g., a first luminance band, a second luminance band, a third luminance band, etc.).

Alternatively, the gate driver 130 may be configured to adjust the magnitude of the gate-on voltage VGL of the transistor T1 based on the low-potential driving voltage VSSEL of the light-emitting element EL by a group of luminance bands (hereinafter, a luminance band group) of the display panel 110 (e.g., a first luminance band group, a second luminance band group, a third luminance band group, etc.). For example, the first luminance band group may include the first luminance band to the third luminance band, the second luminance band group may include a fourth luminance band to a sixth luminance band, and the third luminance band group may include a seventh luminance band to a thirteenth luminance band. However, embodiments of the present disclosure are not limited thereto.

According to an example embodiment, the gate driver 130 may be configured to sum the low-potential driving voltage VSSEL, the anode reset voltage to the light-emitting element EL, and the difference T1_Vgs between the voltages of the gate electrode and the source electrode of the transistor T1 with each other and to determine the magnitude of the voltage to be applied to the gate electrode of the transistor T1 based on the summing result. For example, the gate driver 130 may be configured to sum the low-potential driving voltage VSSEL varying based on the luminance band, the anode reset voltage (e.g., the voltage at the node N1), and the gate-source voltage T1_Vgs of the transistor T1 with each other and apply the voltage of the summing result to the gate electrode of the transistor T1. Thus, the light-emitting element EL may be turned on based on the applied voltage of the summing result.

According to an example embodiment, the gate driver 130 may be configured to increase the magnitude of the voltage to be applied to the gate electrode of the transistor T1 as the luminance band of the display panel 110 is lowered.

According to an example embodiment, the gate driver 130 may be configured to adjust the magnitude of the voltage to be applied to the gate electrode of the transistor T1 based on the low-potential driving voltage VSSEL of the light-emitting element EL in the display panel 110.

For example, the power supply 150 may be configured to supply power for driving the display panel 110 to the display panel 110. Then, the gate driver 130 may be configured to adjust the magnitude of the voltage to be applied to the gate electrode of the transistor based on the low-potential driving voltage of the light-emitting element in the display panel 110.

To this end, when the magnitude of the adjusted voltage is smaller than a first threshold voltage (e.g., −6.6 V), the power supply 150 may be configured to charge-pump the adjusted voltage by multiplying the adjusted voltage by a first constant (e.g., 3), and apply the charge-pumped voltage to the gate electrode of the transistor T1 through the gate driver 130. Thereafter, the light-emitting element EL may be turned on based on the applied voltage of the summing result.

Furthermore, when the magnitude of the adjusted voltage is greater than the first threshold voltage (e.g., −6.6 V), the power supply 150 may be configured to charge-pump the adjusted voltage by multiplying the adjusted voltage by a second constant (e.g., 2), and apply the charge-pumped voltage to the gate electrode of the transistor T1 through the gate driver 130. Afterwards, the light-emitting element EL may be turned on based on the applied voltage of the summing result.

For example, each of a value (e.g., 3) of the first constant and a value (e.g., 2) of the second constant may be variable according to a design of the display panel 110. The present disclosure is not limited to the values of the first and second constants.

According to an example embodiment, the gate driver 130 may be configured to adjust the magnitude of the voltage to be applied to the gate electrode of the transistor T1 using the low-potential driving voltage VSSEL of the light-emitting element EL that is variable based on an interpolation between the luminance bands of the display panel.

Figure 5:
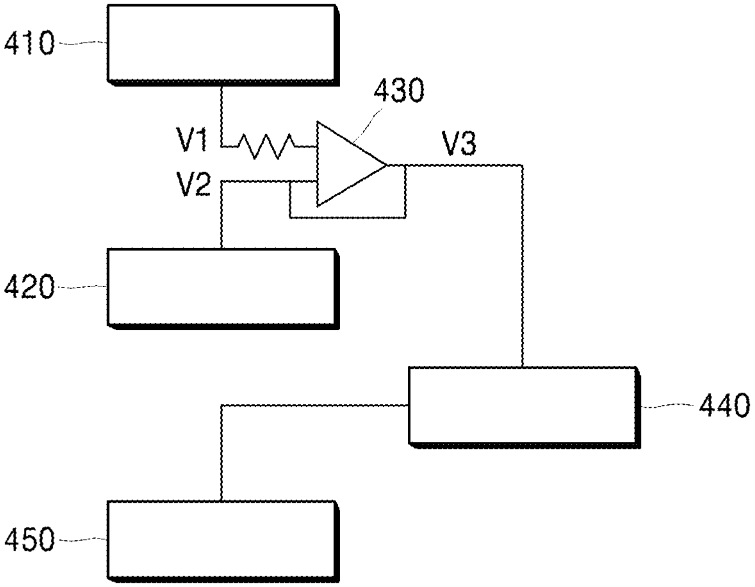
FIG. 5 is an example diagram showing a process of generating a gate-on voltage to be applied to a gate electrode of a transistor according to an embodiment of the present disclosure.

FIG. 5 is an example diagram showing a process of generating a gate-on voltage to be applied to the gate electrode of the transistor according to an example embodiment of the present disclosure.

As shown in FIG. 5, according to an example embodiment of the present disclosure, to supply the gate-on voltage varying based on the luminance band to the gate electrode of the transistor T1, the gate driver 130 may be configured to adjust the gate-on voltage in consideration of interpolation between the luminance bands. Furthermore, the gate driver 130 may be configured to include a circuit that may be configured to adjust the gate-on voltage VGL using the low-potential driving voltage VSSEL. For example, the gate driver 130 may be configured to generate a positive voltage relative to the limit of the gate-on voltage VGL and apply the generated voltage to the gate electrode of the transistor T1.

According to an example embodiment, the power supply 150 may be configured to optimize analog driving power for light emission of the light-emitting element EL of the display panel 100 and supply the optimized analog driving power to the display panel 100. Further, the power supply 150 may be configured to perform interpolation to optimize the gate-on voltage VGL in supplying the low-potential driving voltage VSSEL for light emission of the light-emitting element EL. Furthermore, the power supply 150 may be configured to change a step of a charge pump of the power supply 150 based on the gate-on voltage VGL.

According to an example embodiment, the gate driver 130 may be configured to operate so that the gate-on voltage VGL varying based on the luminance of the pixel is supplied to the pixel to reduce constant power consumption when the gate-on voltage VGL is generated in the power supply 150 (e.g., Power Management Integrated Circuit: PMIC).

To this end, to supply the gate-on voltages VGL varying based on the luminance of the pixel to the pixel, the gate driver 130 may be configured to include the circuit that is configured to adjust the gate-on voltage VGL based on the low-potential driving voltage VSSEL varying based on an interpolation between luminance bands.

According to an example embodiment, the gate driver 130 may be configured to generate the positive voltage compared to the limit of the gate-on voltage VGL and apply the generated voltage to the gate electrode of the transistor T1.

According to an example embodiment, the power supply 150 may be configured to charge-pump the input voltage thereto to output the gate-on voltage VGL. In this regard, the gate driver 130 may be configured to allow the power supply 150 to output the gate-on voltage VGL of the low step, thereby lowering the constant power consumption.

According to an example embodiment, the power supply 150 may be configured to include circuitry that is configured to adjust the magnitude of the gate-on voltage VGL to be applied to the gate electrode of the transistor T1 via the gate driver 130.

According to an example embodiment, a voltage circuit 410 may be configured to input a maximum voltage V1 as a maximum value to a first terminal of a comparator 430. A first interpolation circuit 420 may be configured to input the gate-on voltage VGL (i.e., V2) to a second terminal of the comparator 430. The gate-on voltage VGL (e.g., V2) from the first interpolation circuit 420 may be a low-potential driving voltage VSSEL that varies depending on the luminance band.

According to an example embodiment, the comparator 430 may be configured to provide, to a second interpolation circuit 440, a voltage for obtaining the gate-on voltage VGL (e.g., V3) to be input to the gate electrode of the transistor T1 based on the maximum voltage V1 input to the first terminal and the gate-on voltage VGL (e.g., V2) input to the second terminal. The second interpolation circuit 440 may be configured to provide a result of performing interpolation between luminance bands to a charge pump circuit 450.

According to an example embodiment, when the magnitude of the gate-on voltage VGL obtained through the comparator 430 and the second interpolation circuit 440 is smaller than the first threshold voltage (e.g., −6.6 V), the charge pump circuit 450 may be configured to multiply the obtained gate-on voltage VGL by the first constant (e.g., 3) to charge-pump the obtained gate-on voltage. Thus, the gate driver 13 may be configured to supply the charge-pumped gate-on voltage VGL to the gate electrode of the transistor T1.

Furthermore, when the magnitude of the gate-on voltage VGL obtained through the comparator 430 and the second interpolation circuit 440 is greater than the first threshold voltage (e.g., −6.6 V), the charge pump circuit 450 may be configured to multiply the obtained gate-on voltage VGL by the second constant (e.g., 2) to charge-pump the obtained gate-on voltage. Thus, the gate driver 13 may be configured to supply the charge-pumped gate-on voltage VGL to the gate electrode of the transistor T1.

The value (e.g., −6.6 V) of the first threshold voltage, the value (e.g., 3) of the first constant and the value (e.g., 2) of the second constant may be variable according to the design, process, and other environments of the display device 100, such as the display panel 110, the power supply 150, the gate driver 130, and the luminance band. Thus, the present disclosure is not limited to the specific numerical values.

The display device 100 according to an example embodiment of the present disclosure may be configured to generate a positive voltage relative to the maximum voltage (e.g., V1) of the gate-on voltage VGL in a waveform of the light-emission control signal EM of FIG. 4 and apply the generated voltage to the gate electrode of the transistor T1, thereby lowering the constant power consumption and maintaining the light emission performance.

FIG. 6 is a diagram showing an example of generating the gate-on voltage based on luminance according to an example embodiment of the present disclosure.

As shown in FIG. 6, in the first luminance band (e.g., 3), the low-potential driving voltage may be A (e.g., −7.2 V), and the gate-on voltage VGL to be applied to the gate electrode of the transistor T1 may be −10.4 V. In the second luminance band (e.g., 4), the low-potential driving voltage may be A+1, and the gate-on voltage VGL to be applied to the gate electrode of the transistor T1 may be a value (e.g., xxV) greater than −10.4 V.

For example, the interpolation between the first luminance band (e.g., 3) and the second luminance band (e.g., 4) may be performed. Due to the interpolation, the gate-on voltage VGL may be greater than −10.4 V but smaller than the voltage (e.g., xxV).

The power supply 150 may be configured to sum the low-potential driving voltage VSSEL, the anode reset voltage to the light-emitting element EL, and the difference T1_Vgs between the voltages of the gate electrode and the source electrode of the transistor T1 with each other and to determine the magnitude of the voltage to be applied to the gate electrode of the transistor T1 based on the summing result.

FIG. 7 is an example diagram showing a relationship between the low-potential driving voltage and the gate-on voltage, based on a luminance band of the display panel according to an example embodiment of the present disclosure.

As shown in FIG. 7, the low-potential driving voltage corresponding to the first luminance band (e.g., 2175 nit) may be A, the low-potential driving voltage corresponding to the second luminance band (e.g., 1600 nit) may be A−0.5, and the low-potential driving voltage corresponding to the third luminance band (e.g., 1200 nit) may be A−7.2 V. The low-potential driving voltage corresponding to the fourth luminance band (e.g., 650 nit) may be A+1.0, the low-potential driving voltage corresponding to the fifth luminance band (e.g., 450 nit) may be A+1.9, the low-potential driving voltage corresponding to the sixth luminance band (e.g., 300 nit) may be A+2.0, and the low-potential driving voltage corresponding to each of the seventh luminance band to the thirteenth luminance band may be A+2.3.

The power supply 150 may be configured to adjust the gate-on voltage VGL based on the luminance band and apply the adjusted gate-on voltage VGL to the gate electrode of the transistor T1 via the gate driver 130. In this case, the gate-on voltage VGL may be adjusted to be variable based on the luminance and then applied to the gate electrode of the transistor T1 via the gate driver. Thereafter, the light-emitting element EL may be turned on based on the variably adjusted voltage.

As the luminance of the display panel decreases, the magnitude of the voltage to be applied to the gate electrode of the transistor may increase.

In the display device 100 according to an example embodiment of the present disclosure, the gate-on voltage VGL variably adjusted based on the luminance band is applied to the gate electrode of the transistor T1, thereby reducing the power consumption while maintaining the light emission performance.

Figure 8:
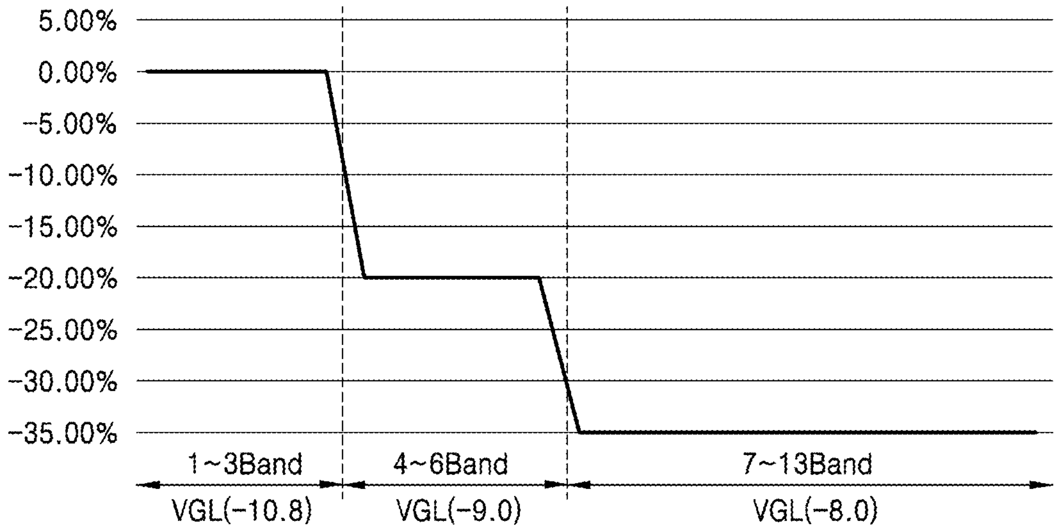
FIG. 8 is an example diagram showing a relationship between the low-potential driving voltage and the gate-on voltage based on a luminance band group according to an embodiment of the present disclosure.

FIG. 8 is an example diagram showing a relationship between the low-potential driving voltage and the gate-on voltage based on a luminance band group according to an example embodiment of the present disclosure.

As shown in FIG. 8, it may be identified that when-10.8 V of the gate-on voltage VGL is applied in the first luminance band group (e.g., the first luminance band to the third luminance band), −9.0 V of the gate-on voltage VGL is applied in the second luminance band group (e.g., the fourth luminance band to the sixth luminance band), and −8.0 V of the gate-on voltage VGL is applied in the third luminance band group (e.g., the seventh luminance band to the thirteenth luminance band), the power consumption in the second luminance band group is reduced by about 20% compared to the power consumption in the first luminance band group, and the power consumption in the third luminance band group is reduced by about 35% compared to the power consumption in the first luminance band group.

In the display device 100 according to an example embodiment of the present disclosure, the gate-on voltage VGL variably adjusted based on the luminance band group may be applied to the gate electrode of the transistor T1, thereby reducing the power consumption while maintaining the light emission performance.

The display device according to various embodiments of the present disclosure may be applied to a mobile device, a video phone, a smart watch, a watch phone, a wearable device, a foldable device, a rollable device, a bendable device, a flexible device, a curved device, a sliding device, a variable device, an electronic notebook, an electronic book, a portable multimedia player (PMP), a personal digital assistant (PDA), an MP3 player, a mobile medical device, a desktop PC, a laptop PC, a netbook computer, a workstation, a navigation device, a vehicle navigation device, a vehicle display device, a vehicle device, a theater device, a theater display device, a television, a wallpaper device, a signage device, a game device, a notebook, a monitor, a camera, a camcorder, and a home appliance.

A display device according to an aspect and some embodiments of the present disclosure may be described as follows.

In an aspect of the present disclosure, a display device includes: a display panel including pixels, data lines and gate lines; a data driver connected to the data lines; and a gate driver connected to the gate lines, wherein the gate driver is configured to adjust a magnitude of a voltage to be applied to a gate electrode of a transistor of the pixels, based on a low-potential driving voltage of a light-emitting element of the pixels in the display panel.

In accordance with some embodiments of the display device, the gate driver is configured to adjust a magnitude of a gate-on voltage of the transistor, based on the low-potential driving voltage of the light-emitting element for each luminance band of the pixel of the display panel.

In accordance with some embodiments of the display device, the gate driver is configured to adjust a magnitude of a gate-on voltage of the transistor, based on the low-potential driving voltage of the light-emitting element for each luminance band group of the display panel.

In accordance with some embodiments of the display device, the gate driver is configured to: sum the low-potential driving voltage, an anode reset voltage to the light-emitting element, and a voltage difference between a voltage of a gate electrode and a voltage of a source electrode of the transistor with each other; determine the summing result as a gate-on voltage of the transistor; and apply the gate-on voltage to the gate electrode of the transistor.

In accordance with some embodiments of the display device, as a luminance level of the pixel of the display panel decreases, the magnitude of the voltage to be applied to the gate electrode of the transistor increases.

In accordance with some embodiments of the display device, the display device further comprises a power supply for supplying power to the display panel, wherein in response to that the magnitude of the adjusted voltage is smaller than a first threshold voltage, the power supply is configured to multiply the adjusted voltage by a first constant, and wherein the gate driver is configured to apply a voltage of a value obtained by multiplying the adjusted voltage by the first constant to the gate electrode of the transistor.

In accordance with some embodiments of the display device, in response to that the magnitude of the adjusted voltage is greater than the first threshold voltage, the power supply is configured to multiply the adjusted voltage by a second constant, and wherein the gate driver is configured to apply a voltage of a value obtained by multiplying the adjusted voltage by the second constant to the gate electrode of the transistor.

In accordance with some embodiments of the display device, the first constant is greater than the second constant.

In accordance with some embodiments of the display device, the power supply is configured to adjust the magnitude of the voltage to be applied to the gate electrode of the transistor, based on the low-potential driving voltage of the light-emitting element of the pixel, wherein the low-potential driving voltage varies based on an interpolation between luminance bands of the pixel of the display panel.

Although some example embodiments of the present disclosure have been described above with reference to the accompanying drawings, the present disclosure may not be limited to those embodiments and may be implemented in various different forms. Those of ordinary skill in the technical field to which the present disclosure belongs will be able to appreciate that the present disclosure may be implemented in other specific forms without departing from the technical idea or features of the present disclosure. Therefore, it should be understood that embodiments as described above are not restrictive but illustrative in all respects.

What is claimed is:

1. A display device, comprising:

a display panel including pixels, each pixel having a driving transistor for generating a driving current, a light-emitting element connected between a first node and an input terminal of a low-potential driving voltage and emitting light according to the driving current, and a first transistor connected between the driving transistor and the first node; and a gate driver configured to generate an emission control signal of a gate-on voltage and supply the emission control signal of the gate-on voltage to a gate electrode of the first transistor, wherein a magnitude of the gate-on voltage of the emission control signal changes according to a luminance level of the pixels, and wherein the emission control signal has a first gate-on voltage at a first luminance level of the pixels and has a second gate-on voltage greater than the first gate-on voltage at a second luminance level lower than the first luminance level of the pixels.

2. The display device of claim 1, wherein the low-potential driving voltage varies based on luminance bands of the pixels of the display panel.

3. The display device of claim 1, wherein the gate driver is configured to adjust the magnitude of the gate-on voltage of the emission control signal, based on the low-potential driving voltage of the light-emitting element for each luminance band of the pixels of the display panel.

4. The display device of claim 2, wherein the low-potential driving voltage varies based on an interpolation between the luminance bands.

5. The display device of claim 1, wherein the gate driver is configured to adjust the magnitude of the gate-on voltage of the emission control signal, based on the low-potential driving voltage of the light-emitting element for each luminance band group of the display panel.

6. The display device of claim 1, wherein the gate driver is configured to:

determine a sum the low-potential driving voltage, an anode reset voltage to the light-emitting element, and a voltage difference between a voltage of the gate electrode and a voltage of a source electrode of the first transistor as the gate-on voltage of the emission control signal; and apply the gate-on voltage of the emission control signal to the gate electrode of the first transistor.

7. The display device of claim 6, wherein as a luminance level of the pixels of the display panel decreases, the magnitude of the gate-on voltage to be applied to the gate electrode of the first transistor increases, and wherein as a luminance level of the pixels of the display panel decreases, the magnitude of the low-potential driving voltage increases.

8. The display device of claim 1, further comprising a power supply for supplying power to the display panel, wherein, in response to the magnitude of the gate-on voltage of the emission control signal being smaller than a first threshold voltage, the power supply is configured to multiply the gate-on voltage of the emission control signal by a first constant, and wherein the gate driver is configured to apply a voltage of a value obtained by multiplying the gate-on voltage of the emission control signal by the first constant to the gate electrode of the first transistor.

9. The display device of claim 8, wherein:

in response to the magnitude of the gate-on voltage of the emission control signal being greater than the first threshold voltage, the power supply is further configured to multiply the gate-on voltage of the emission control signal by a second constant; and the gate driver is configured to apply a voltage of a value obtained by multiplying the gate-on voltage of the emission control signal by the second constant to the gate electrode of the first transistor.

10. The display device of claim 9, wherein the first constant is greater than the second constant.

11. The display device of claim 8, wherein:

the power supply is configured to adjust the magnitude of the voltage to be applied to the gate electrode of the first transistor, based on the low-potential driving voltage of the light-emitting element of the pixels; and the low-potential driving voltage varies based on an interpolation between luminance bands of the pixels of the display panel.

* * * * *